(12) United States Patent
Sun

(10) Patent No.: US 12,050,379 B1
(45) Date of Patent: Jul. 30, 2024

(54) DISPLAY MODULES, METHODS OF MANUFACTURING A DISPLAY MODULE, AND SPLICED DISPLAY DEVICES

(71) Applicant: Guangzhou China Star Optoelectronics Semiconductor Display Technology Co., Ltd., Guangdong (CN)

(72) Inventor: Bo Sun, Guangdong (CN)

(73) Assignee: Guangzhou China Star Optoelectronics Semiconductor Display Technology Co., Ltd., Guangzhou (CN)

( * ) Notice: Subject to any disclaimer, the term of this patent is extended or adjusted under 35 U.S.C. 154(b) by 0 days.

(21) Appl. No.: 18/128,297

(22) Filed: Mar. 30, 2023

(30) Foreign Application Priority Data

Jan. 31, 2023  (CN) .......................... 202310073217.4

(51) Int. Cl.
  *G02F 1/1333*  (2006.01)
  *G02F 1/1335*  (2006.01)
  *H01L 25/075*  (2006.01)

(52) U.S. Cl.
  CPC .... *G02F 1/13336* (2013.01); *G02F 1/133528* (2013.01); *H01L 25/0753* (2013.01); *G02F 2201/44* (2013.01)

(58) Field of Classification Search
  CPC .......... G02F 1/13336; G02F 1/133528; G02F 2201/44; H01L 25/0753
  USPC .......................................................... 349/73
  See application file for complete search history.

(56) References Cited

FOREIGN PATENT DOCUMENTS

| CN | 108181752 A | * | 6/2018 | ......... G02F 1/13306 |
| CN | 113658542 A | * | 11/2021 | |
| KR | 20140122822 A | * | 10/2014 | |

* cited by examiner

*Primary Examiner* — Michael H Caley
*Assistant Examiner* — William D Peterson
(74) *Attorney, Agent, or Firm* — PV IP PC; Zhigang Ma; Wei Te Chung

(57) ABSTRACT

A display module includes a main display panel having a light-emitting side and including a display part and a non-display part, a secondary display panel disposed on the light-emitting side of the main display panel and corresponding to the non-display part, and a privacy protection function layer disposed on a side of the secondary display panel away from the main display panel. An orthographic projection of the privacy protection function layer on the main display panel overlaps the display part and the secondary display panel.

20 Claims, 2 Drawing Sheets

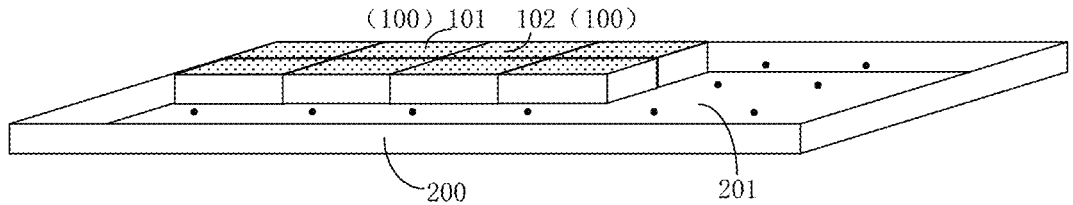

FIG. 4

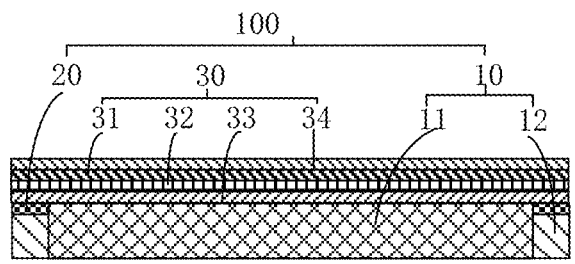

FIG. 5

| Providing a main display panel and a secondary display panel, the main display panel having a light-emitting side, and including a display part and a non-display part; the secondary display panel being disposed on the light-emitting side of the main display panel and corresponding to the non-display part | — S01 |

↓

| Forming a polarization film on a side of the secondary display panel away from the main display panel | — S02 |

FIG. 6

DISPLAY MODULES, METHODS OF MANUFACTURING A DISPLAY MODULE, AND SPLICED DISPLAY DEVICES

CROSS-REFERENCE TO RELATED APPLICATION

This application claims priority to Chinese Patent Application No. 202310073217.4, filed on Jan. 31, 2023, the disclosure of which is incorporated herein by reference in its entirety.

TECHNICAL FIELD

The present disclosure relates to display technologies, and in particular, to display modules, methods of manufacturing a display module, and spliced display devices.

BACKGROUND

With development of display technologies, a seamless spliced display technology has been widely concerned. A spliced display screen generally includes multiple spliced display sub-screens. Since each sub-screen has a display area and a non-display area outside the display area, there are generally splice gaps between the spliced display sub-screens in an actual display process.

A way of providing compensation display devices above the non-display areas between the respective display areas of two spliced display sub-screens has been proposed to achieve seamless spliced display effect. However, at a side viewing angle, since luminance and attenuation degrees of visual brightness of the display area of the spliced display sub-screens are different from those of the compensation display device, it is easy to cause a problem that the visual brightness of the display area of the spliced display sub-screen is inconsistent with the visual brightness of the compensation display device above the non-display areas of the spliced display sub-screen.

SUMMARY

In view of the above, a display module according to an embodiment of the present disclosure is provided. The display module includes a main display panel having a light-emitting side and including a display part and a non-display part, a secondary display panel disposed on the light-emitting side of the main display panel and corresponding to the non-display part, and a privacy protection function layer disposed on a side of the secondary display panel away from the main display panel; and an orthographic projection of the privacy protection function layer on the main display panel overlaps the display part and the secondary display panel.

In addition, a method of manufacturing a display module according to an embodiment of the present disclosure is provided. The method includes following steps:
providing a main display panel and a secondary display panel, the main display panel having a light-emitting side, and including a display part and a non-display part, the secondary display panel being disposed on the light-emitting side of the main display panel and corresponding to the non-display part; and
forming a polarization film on a side of the secondary display panel away from the main display panel; and herein, the polarization film includes a first protection layer, a privacy protection function layer, a polarization function layer, and a second protection layer successively stacked and arranged in a direction away from the main display panel, and an orthographic projection of the privacy protection function layer on the main display panel overlaps the display part and the secondary display panel.

In addition, a spliced display device according to an embodiment of the present disclosure is provided. The spliced display device includes a housing and a plurality of above display modules; the housing has an accommodating space, and the plurality of the display modules are arranged in an array in the accommodating space; any two adjacent display modules are in contact with each other.

BRIEF DESCRIPTION OF THE DRAWINGS

FIG. 4 is a schematic structural view of a spliced display device according to Embodiment I of the present disclosure.

FIG. 5 is a schematic section view of a display module according to Embodiment II of the present disclosure.

FIG. 6 is a schematic flowchart of a process for manufacturing the display module according to Embodiment II of the present disclosure.

Figure 1:
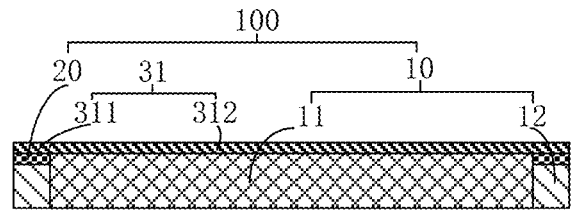
FIG. 1 is a schematic section view of a display module according to Embodiment I of the present disclosure.

List of Reference Numerals in the Drawings
display module 100; first display module 101; second display module 102; housing 200; accommodating space 201; main display panel 10; display part 11; non-display part 12; secondary display panel 20; polarization film 30; privacy protection function layer 31; first area 311; second area 312; polarization function layer 32; first protection layer 33; second protection layer 34.

DETAILED DESCRIPTION

Some embodiments of the present disclosure will be described below in detail with reference to the accompanying drawings, but not intended to limit the present disclosure.

In the present disclosure, where the contrary is not stated, the terms "on", "above", and "below" used usually refer to the up and down of the device in actual use or working condition, specifically the directions in the attached drawings; The terms "inside" and "outside" refer to the outline of the device.

The disclosure below provides a number of different embodiments or examples for implementing different structures of the application. In order to simplify the disclosure of the application, parts and settings for specific examples are described below. Of course, they are only examples and are not intended to restrict the application. In addition, the present disclosure may repeat reference numbers and/or reference letters in different embodiments, such duplication is for the purpose of simplification and clarity, and by itself does not indicate the relationships between the various embodiments and/or settings discussed. In addition, the present disclosure provides examples of various specific processes and materials, but those of ordinary skills in the art may be aware of applications of other processes and/or the use of other materials. It should be noted that the order of description of the following embodiments shall not be regarded as a limitation on the preferred order of embodiments.

Embodiment I

Figure 2:
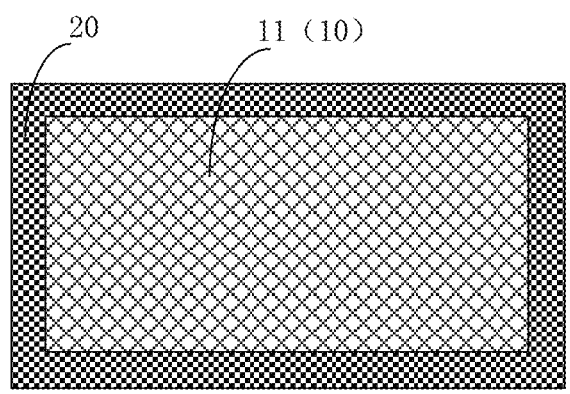
FIG. 2 is a schematic plane view of a main display panel and a secondary display panel of the display module according to Embodiment I of the present disclosure.
Figure 3:
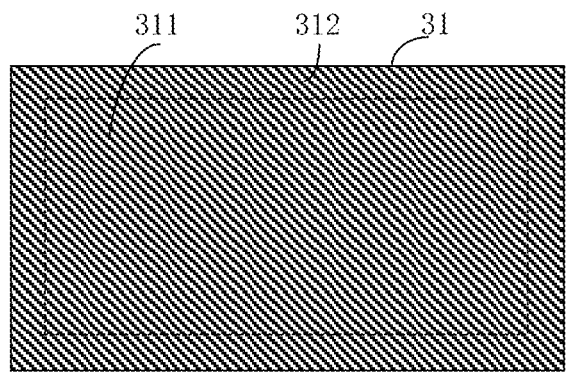
FIG. 3 is a schematic plane view of a privacy protection function layer of the display module according to Embodiment I of the present disclosure.

FIG. 1 is a section view of a display module according to Embodiment I of the present disclosure; FIG. 2 is a schematic plane view of a main display panel and a secondary display panel of the display module according to Embodiment I of the present disclosure; and FIG. 3 is a schematic plane view of a privacy protection function layer of the display module according to Embodiment I of the present disclosure. As shown in FIG. 1 to FIG. 3, in a first aspect, a display module 100 is provided in Embodiment I of the present disclosure. The display module 100 includes a main display panel 10, a secondary display panel 20, and a privacy protection function layer (for example, a privacy film) 31.

The main display panel 10 has a light-emitting side, and includes a display part 11 and a non-display part 12. The secondary display panel 20 is disposed on the light-emitting side of the main display panel 10 and corresponds to the non-display part 12. The privacy protection function layer 31 is disposed on a side of the secondary display panel 20 away from the main display panel 10. An orthographic projection of the privacy protection function layer 31 on the main display panel 10 overlaps the display part 11 and the secondary display panel 20.

In the display module 100 provided in the present disclosure, because the orthographic projection of the privacy protection function layer 31 on the main display panel 10 overlaps the display part 11 and the secondary display panel 20, the privacy protection function layer 31 can simultaneously restrict a side outgoing light of the display part 11 and a side outgoing light of the secondary display panel 20. Thus, a brightness difference between an area of the display module 100 corresponding to the display part 11 and an area of the display module 100 corresponding to the secondary display panel 20 is greatly reduced or eliminated, and a display uniformity of the display module 100 in a side view is improved, so as to improve a display quality of the display module 100. Moreover, because the orthographic projection of the privacy protection function layer 31 on the main display panel 10 simultaneously overlaps the display part 11 and the secondary display panel 20, an arrangement area of the privacy protection function layer 31 is greatly increased. Thus, an arrangement difficulty of the privacy protection function layer 31 is reduced, and an assembly stability of the privacy protection function layer 31 on the display module 100 is improved, so as to prolong a service life of the display module 100.

Specifically, the privacy protection function layer 31 includes a first area 311 and a second area 312. The first area 311 corresponds to the display part 11, and the second area 312 corresponds to the secondary display panel 20. A brightness value of the first area 311 is defined as a, and a brightness value of the second area 312 is defined as b, where (|a−b|:a)≤(1:100). That is, the privacy protection function layer 31 can control a ratio of an absolute value of a difference value between the brightness value of the first area 311 and the brightness value of the second area 312 and the brightness value of the first area 311 below 1%, so that the display uniformity of the display module 100 in the side view is greatly improved.

For example, when the brightness value of the first area 311 is 500 nits, the brightness value of the second area 312 is controlled between 495 nits and 505 nits.

In embodiments of the present disclosure, a brightness of the display part 11 at a front viewing angle is defined as a first brightness, and a brightness of the display part 11 at a preset angle of side viewing is defined as a s second brightness. A brightness of the secondary display panel 20 at the front viewing angle is the first brightness, and a brightness of the secondary display panel 20 at the preset angle of side viewing is defined as a third brightness. A value of the third brightness is different from a value of the second brightness.

Specifically, when brightness values of the display part 11 and the secondary display panel 20 of the main display panel 10 at the front viewing angle are equal, the brightness values of the display part 11 and the secondary display panel 20 at the preset angle of side viewing are different due to different display characteristics of the display part 11 and the secondary display panel 20, so that the display part 11 and the secondary display panel 20 have brightness differences at the preset angle of side viewing.

In the present disclosure, the orthographic projection of the privacy protection function layer 31 disposed on the light-emitting sides of the main display panel 10 and the secondary display panel 20 on the main display panel 10 is designed to simultaneously overlap the display part 11 and the secondary display panel 20. Thus, the privacy protection function layer 31 can simultaneously restrict the side outgoing light of the display part 11 and the side outgoing light of the secondary display panel 20. In this way, the brightness difference between the area of the display module 100 corresponding to the display part 11 and the area of the display module 100 corresponding to the secondary display panel 20 is greatly reduced or eliminated, and the display uniformity of the display module 100 in the side view is improved, so as to improve the display quality of the display module 100.

In embodiments of the present disclosure, the main display panel 10 includes a display area and a non-display area. A part of the main display panel 10 corresponding to the display area is the display part 11, and a part of the main display panel 10 corresponding to the non-display area is the non-display part 12. The first brightness of the display part 11 at the front viewing angle refers to a normalized brightness of the display part 11 at the front viewing angle when the display part 11 is not overlapped by the privacy protection function layer 31, and the second brightness of the display part 11 at the preset angle of side viewing refers to a normalized brightness of the display part 11 under the preset angle when the display part 11 is not overlapped by the privacy protection function layer 31. The first brightness of the secondary display panel 20 at the front viewing angle refers to a normalized brightness of the secondary display panel 20 at the front viewing angle when the secondary display panel 20 is not overlapped by the privacy protection function layer 31, and the third brightness of the secondary display panel 20 at the preset angle of side viewing refers to a normalized brightness of the secondary display panel 20 under the preset angle when the secondary display panel 20 is not overlapped by the privacy protection function layer 31.

Moreover, an angle of the front view is 90°, and the preset angle is defined as a, which is taken from any angle value within an interval (0°,90°).

In embodiments of the present disclosure, the main display panel 10 may be a liquid crystal display (LCD for short) panel. The main display panel 10 includes a backlight module, an array substrate, a color filter substrate, liquid crystals, and a sealant. The liquid crystals and the sealant are arranged between the array substrate and the color filter substrate. Herein, an arrangement area of the liquid crystals corresponds to the display part 11, and an arrangement area of the sealant corresponds to the non-display part 12. The array substrate further includes, for example, a gate driving circuit corresponding to the non-display part 12.

In embodiments of the present disclosure, the secondary display panel 20 may be a mini light emitting diode (Mini LED for short) display panel. The secondary display panel 20 includes a driving backplane and a Mini LED array disposed on the driving backplane. Because different types of display panels of the main display panel 10 and the secondary display panel 20, the display characteristics of the display part 11 and the secondary display panel 20 are different.

It should be noted that the present disclosure does not restrict the types of the main display panel 10 and the secondary display panel 20, which are different in other embodiments of the present disclosure. The main display panel 10 and the secondary display panel 20 can be selected from two kinds of an LCD panel, a micro LED display panel, a Mini LED display panel, an organic LED display panel, and a quantum dot display panel.

Referring to FIG. 1 to FIG. 3, in embodiments of the present disclosure, the privacy protection function layer 31 includes a plurality of first microstructures (not shown in figures) disposed in the first area 311 and a plurality of second microstructures (not shown in figures) disposed in the second area 312, and structures of the first microstructures are same with structures of the second microstructures.

In the display module 100 provided in the present disclosure, the first microstructures and the second microstructures are microstructures of the privacy protection function layer 31 configured to restrict the outgoing light in the side view. The microstructures are similar to microstructures of a privacy film in the related art, and specific details of the microstructures are not elaborated in the present disclosure.

In addition, because the structures of the first microstructures and the structures of the second microstructures are the same, there is no need to carry out differential designs of the microstructures of the privacy protection function layer 31 for the first area 311 and the second area 312 during a manufacturing process of the privacy protection function layer 31. Thus, a production difficulty of the privacy protection function layer 31 is greatly reduced, a production process is simplified, and a production costs is reduced.

Moreover, a distribution density of the first microstructures in the first area 311 is defined as a first density, a distribution density of the second microstructures in the second area 312 is defined as a second density, and a value of the first density is less than or equal to a value of the second density.

In the display module 100 provided in the present disclosure, a value of the second brightness is less than a value of the third brightness. Herein, when the value of the first density is equal to the value of the second density, the first area 311 and the second area 312 of the privacy protection function layer 31 can be prepared in a same production standard due to the same distribution density of the microstructures in the first area 311 and the second area 312. Thus, the production difficulty of the privacy protection function layer 31 is further reduced, the production process is further simplified, and the production costs is further reduced.

Herein, when the value of the first density is less than the value of the second density, a value of the second brightness is less than a value of the third brightness, and the distribution density of the first microstructures in the first area 311 is less than the distribution density of the second microstructures in the second area 312, so compared with the outgoing light of the secondary display panel 20 at the preset angle of side viewing restricted by the privacy protection function layer 31, the outgoing light of the display part 11 at the preset angle of side viewing is less restricted by the privacy protection function layer 31. Thus, a problem that the brightness value of the display part 11 at the preset angle of side viewing is less than the brightness value of the secondary display panel 20 at the preset angle of side viewing can be better relieved or eliminated, and the display uniformity of the display module 100 under the side view is improved, so as to improve the display quality of the display module 100.

For example, the main display panel 10 is an LCD panel, and the secondary display panel 20 is a Mini LED display panel. A value of the second brightness is less than a value of the third brightness. At the preset angle of side viewing, a brightness value of the first area 311 is less than a brightness value of the display part 11 not overlapped by the privacy protection function layer 31, and a brightness value of the second area 312 is less than the brightness value of the secondary display panel 20 not overlapped by the privacy protection function layer 31.

When the preset angle is 45°, an absolute value of a difference value between the brightness value of the first area 311 and the brightness value of the display part 11 not overlapped by the privacy protection function layer 31 is the largest, and an absolute value of a difference value between the brightness value of the second area 312 and the brightness value of the secondary display panel 20 not overlapped by the privacy protection function layer 31 is the largest.

It should be noted that, a magnitude relationship between the second brightness and the third brightness is not restricted in the present disclosure. In other embodiments of the present disclosure, a value of the second brightness may be greater than a value of the third brightness. When the value of the second brightness is greater than the value of the third brightness, a value of the first density may also be greater than a value of the second density.

In a second aspect, a spliced display device is further provided in Embodiment I of the present disclosure.

FIG. 4 is a schematic structural view of the spliced display device according to Embodiment I of the present disclosure. As shown in FIG. 1 to FIG. 4, the spliced display device includes a housing 200 and a plurality of the display modules 100. Herein, the housing 200 has an accommodating space 201. The plurality of the display module 100 are arranged in an array in the accommodating space 201, and any two adjacent display modules 100 are in contact with each other.

In embodiments of the present disclosure, the privacy protection function layer 31 of the display module 100 includes the first area 311 and the second area 312. The first area 311 corresponds to the display part 11, and the second area 312 corresponds to the secondary display panel 20. The privacy protection function layer 31 incudes the plurality of first microstructures in the first area 311and the plurality of second microstructures in the second area 312. The structures of the first microstructures are same with the structures of the second microstructures. The distribution density of the first microstructures in the first area 311 is the first density, the distribution density of the second microstructures in the second area 312 is the second density, and the first density is equal to the second density. Herein, one of the adjacent two display modules 100 is defined as a first display module 101, and the other one of the adjacent two display modules 100 is defined as a second display module 102. The privacy protection function layer 31 of the first display module 101 and the privacy protection function layer 31 of the second display module 102 are integrally formed.

In the spliced display device provided in the present disclosure, the first microstructures in the first area 311 and the second microstructures in the second area 312 of the display module 100 have the same structures and the same density, so the privacy protection function layer 31 in each area of the display module 100 can be prepared in the same production standard. Accordingly, when the plurality of the display modules 100 are provided with the privacy protection function layers 31 on their light-emitting sides, the privacy protection function layers 31 of any adjacent two display modules 100 can be integrally formed. Thus, an assembly process of the spliced display device is greatly simplified, and a manufacturing costs of the spliced display device is reduced.

In embodiments of the present disclosure, the secondary display panel 20 of the first display module 101 and the secondary display panel 20 of the second display module 102 are integrally formed.

In the spliced display device provided in the present disclosure, because the secondary display panels 20 of the adjacent two display modules 100 are integrally formed, the secondary display panels 20 in all of the display modules 100 can be assembled in one piece, which further reduces the manufacturing costs of the spliced display device. Of course, in other embodiments of the present disclosure, the secondary display panels 20 may also be independently assembled into the accommodating space 201 of the housing 200 in units of the display modules 100.

Embodiment II

FIG. 5 is a section view of a display module according to Embodiment II of the present disclosure. Referring to FIG. 5, in a first aspect, a display module 100 is provided in Embodiment II of the present disclosure. The display module 100 includes a main display panel 10, a secondary display panel 20, and a privacy protection function layer 31. The main display panel 10 has a light-emitting side, and includes a display part 11 and a non-display part 12. The secondary display panel 20 is disposed on the light-emitting side of the main display panel 10 and corresponds to the non-display part 12. The privacy protection function layer 31 is disposed on a side of the secondary display panel 20 away from the main display panel 10. An orthographic projection of the privacy protection function layer 31 on the main display panel 10 overlaps the display part 11 and the secondary display panel 20.

A structure of the display module 100 according to Embodiment II of the present disclosure is similar to a structure of the display module 100 according to Embodiment I of the present disclosure, and same parts of the display module 100 are not repeated in Embodiment II of the present disclosure.

The difference is that the display module 100 in Embodiment II further includes a polarization film 30, and the polarization film 30 includes the privacy protection function layer 31 and a polarization function layer 32.

In the display module 100 provided in the present disclosure, because the privacy protection function layer 31 is integrated in the polarization film 30, the privacy protection function layer 31 can be automatically disposed on the light-emitting sides of the main display panel 10 and the secondary display panel 20 during an attached process of the polarization film 30. Thus, a problem that a film process is increased due to an arrangement of the anti-peeping function layer 31 can be avoided.

In embodiments of the present disclosure, the polarization function layer 32 is disposed on a side of the privacy protection function layer 31 facing the main display panel 10.

In the display module 100 provided in the present disclosure, when the main display panel 10 is an LCD panel, the main display panel 10 further includes a lower polaroid disposed between the backlight module and the array substrate, the lower polaroid is matched with the polarization function layer 32 in the polarization film 30 to emit a polarized light so that the main display panel 10 can normally perform the display function.

The microstructures of the privacy protection function layer 31 may destroy a form of the outgoing polarized light, so the polarization function layer 32 is disposed on the side of the privacy protection function layer 31 facing the main display panel 10, which can avoid an adverse effect of the privacy protection function layer 31 on the polarization function layer 32 and ensure the display quality of the display module 100.

In embodiments of the present disclosure, an orthographic projection of the polarization function layer 32 on the main display panel 10 overlaps the display part 11 and the secondary display panel 20.

In the display module 100 provided in the present disclosure, because the orthographic projection of the polarization function layer 32 on the main display panel 10 overlaps the display part 11 and the secondary display panel 20, an arrangement area of the polarization function layer 32 is same with an arrangement area of the privacy protection function layer 31. Thus, the polarization function layer 32 and the privacy protection function layer 31 can realize integrated cutting in an integration process, which makes the integration process more simple and more convenient. In additional, the polarization function layer 32 arranged on the light-emitting side of the secondary display panel 20 can reduce a reflection of external ambient lights on the secondary display panel 20.

In embodiments of the present disclosure, the polarization film 30 further includes a first protection layer 33 and a second protection layer 34. The first protection layer 33 is disposed on a side of the polarization function layer 32 facing the main display panel 10. An orthographic projection of the first protection layer 33 on the main display panel 10 overlaps the display part 11 and the secondary display panel 20. The second protection layer 34 is disposed on a side of the privacy protection function layer 31 away from the main display panel 10, and an orthographic projection of the second protection layer 34 on the main display panel 10 overlaps the display part 11 and the secondary display panel 20.

In the display module 100 provided in the present disclosure, the first protection layer 33 is disposed on a side of the polarization function layer 32 facing the main display panel 10, and the second protection layer 34 is disposed on a side of the privacy protection function layer 31 away from the main display panel 10, so the first protection layer 33 and the second protection layer 34 can seal and protect the polarization function layer 32 and the privacy protection function layer 31 at the same time, which simplifying a structure of the polarization film 30.

In addition, the orthographic projection of the first protection layer 33 on the main display panel 10 overlaps the display part 11 and the secondary display panel 20, and the orthographic projection of the second protection layer 34 on the main display panel 10 overlaps the display part 11 and the secondary display panel 20, so the polarization function layer 32, the privacy protection function layer 31, the first protection layer 33, and the second protection layer 34 can realize integrated cutting in the integration process, which makes the integration process more simple and more convenient.

FIG. 6 is a schematic flowchart of a process for manufacturing the display module according to Embodiment II of the present disclosure. Referring to FIG. 5 and FIG. 6, in a second aspect, a method of manufacturing a display module is further provided in Embodiment II of the present disclosure. The method of manufacturing the display module includes following steps:

S01, providing a main display panel 10 and a secondary display panel 20, the main display panel 10 having a light-emitting side, and including a display part 11 and a non-display part 12; the secondary display panel 20 being disposed on the light-emitting side of the main display panel 10 and corresponding to the non-display part 12;

S02, forming a polarization film 30 on a side of the secondary display panel 20 away from the main display panel 10.

Herein, the polarization film 30 includes a first protection layer 33, a privacy protection function layer 31, a polarization function layer 32, and a second protection layer 34 successively stacked and arranged in a direction away from the main display panel 10, and an orthographic projection of the privacy protection function layer 31 on the main display panel 10 overlaps the display part 11 and the secondary display panel 20.

Specifically, in the display module manufactured by the above method, the privacy protection function layer 31 includes a first area 311 and a second area 312. The first area 311 corresponds to the display part 11, and the second area 312 corresponds to the secondary display panel 20. A brightness value of the first area 311 is defined as a, and a brightness value of the second area 312 is defined as b, where $(|a-b|:a) \leq (1:100)$. That is, the privacy protection function layer 31 can control a ratio of an absolute value of a difference value between the brightness value of the first area 311 and the brightness value of the second area 312 and the brightness value of the first area 311 below 1%, so that the display uniformity of the display module 100 in the side view is greatly improved.

In addition, in the method of manufacturing the display module according to Embodiment II of the present disclosure, the privacy protection function layer 31 is integrated in the polarization film 30, that is, the polarization film 30 has both a function of polarization and a function of reducing or eliminating the brightness difference between the area of the display module 100 corresponding to the display part 11 and the area of the display module 100 corresponding to the secondary display panel 20. Accordingly, in the method of manufacturing the display module according to Embodiment II of the present disclosure, the polarization film 30 can be arranged on the side of the secondary display panel 20 away from the main display panel 10 through one process, so as to avoid a problem that a film process is increased due to an additional arrangement of the anti-peeping function layer 31. In addition, the privacy protection function layer 31 and the polarization function layer 32 share protection layers, so as to simplify the structure of the display module 100 and realize thinness and lightness of the display module 100.

In a third aspect, a spliced display device is further provided in Embodiment II of the present disclosure. The spliced display device includes a housing 200 and a plurality of the display modules 100. Herein, the housing 200 has an accommodating space 201. The plurality of the display module 100 are arranged in an array in the accommodating space 201, and any two adjacent display modules 100 are in contact with each other.

It should be noted that a structure of the spliced display device according to Embodiment II of the present disclosure is similar to a structure of the spliced display device according to Embodiment I of the present disclosure, and same parts of the spliced display device are not described specifically in Embodiment II of the present disclosure.

The difference is in: one of the adjacent two display modules 100 is defined as a first display module 101, the other one of the adjacent two display modules 100 is defined as a second display module 102, and the polarization film 30 of the first display module 101 and the polarization film 30 of the second display module 102 are integrally formed. Thus, the assembly process of the spliced display device is further simplified, and the manufacturing costs of the spliced display device is reduced.

In summary, among the display module, the method of manufacturing the display module, and the spliced display device provided in the present disclosure, the display module includes the main display panel, the secondary display panel, and the privacy protection function layer. The main display panel includes the light-emitting side, and includes the display part and the non-display part. The secondary display panel is disposed on the light-emitting side of the main display panel and corresponds to the non-display part. The privacy protection function layer is disposed on the side of the secondary display panel away from the main display panel. The orthographic projection of the privacy protection function layer on the main display panel overlaps the display part and the secondary display panel. In the present disclosure, because the orthographic projection of the privacy protection function layer on the main display panel overlaps the display part and the secondary display panel, the privacy protection function layer can simultaneously restrict the side outgoing light of the display part and the side outgoing light of the secondary display panel. Thus, the brightness difference between the area of the display module corresponding to the display part and the area of the display module corresponding to the secondary display panel is greatly reduced or eliminated, and the display uniformity of the display module in the side view is improved, so as to improve the display quality of the display module, reduce the arrangement difficulty of the privacy protection function layer, and improve the assembly stability of the privacy protection function layer on the display module.

The display module, the method of manufacturing the display module, and the spliced display device according to some embodiments of the present disclosure have been described above in detail. Those skilled in the art can make various changes and modifications without departing from the spirit of the present disclosure. Therefore, the described embodiments are not intended to limit the present disclosure.

What is claimed is:

1. A display module, comprising:
 a main display panel, having a light-emitting side, and comprising a display part and a non-display part;
 a secondary display panel, disposed on the light-emitting side of the main display panel, and corresponding to the non-display part; and a privacy protection function layer, disposed on a side of the secondary display panel away from the main display panel; and wherein an orthographic projection of the privacy protection function layer on the main display panel overlaps the display part and the secondary display panel.

2. The display module of claim 1, wherein the display part has a first brightness at a front viewing angle and a s second brightness at a preset angle of side viewing;

the secondary display panel has the first brightness at the front viewing angle and a third brightness at the preset angle of side viewing; and a value of the third brightness is different from a value of the second brightness.

3. The display module of claim 2, wherein the privacy protection function layer has a first area corresponding to the display part and a second area corresponding to the secondary display panel;

the privacy protection function layer comprises a plurality of first microstructures disposed in the first area and a plurality of second microstructures disposed in the second area; and each of the first microstructures and each of the second microstructures have a same structure.

4. The display module of claim 3, wherein a value of the second brightness is less than a value of the third brightness;

the first microstructures have a first distribution density in the first area, and the second microstructures have a second distribution density in the second area; and a value of the first distribution density is less than or equal to a value of the second distribution density.

5. The display module of claim 1, further comprising a polarization function layer, wherein the polarization function layer is disposed on a side of the privacy protection function layer facing the main display panel, and an orthographic projection of the polarization function layer on the main display panel overlaps the display part and the secondary display panel.

6. The display module of claim 5, further comprising a first protection layer and a second protection layer, wherein the first protection layer is disposed on a side of the polarization function layer facing the main display panel, and an orthographic projection of the first protection layer on the main display panel overlaps the display part and the secondary display panel;

the second protection layer is disposed on a side of the privacy protection function layer away from the main display panel, and an orthographic projection of the second protection layer on the main display panel overlaps the display part and the secondary display panel; and the first protection layer, the polarization function layer, the anti-peeping functional layer, and the second protection layer constitute a polarization film.

7. The display module of claim 1, wherein a type of the main display panel is different from a type of the secondary display panel, and each of the main display panel and the secondary display panel is selected from a liquid crystal display panel, a micro light emitting diode display panel, a mini light emitting diode display panel, an organic light emitting diode display panel, and a quantum dot display panel.

8. The display module of claim 7, wherein the main display panel is the liquid crystal display panel and the secondary display panel is the mini light emitting diode display panel.

9. A method of manufacturing a display module, comprising:

providing a main display panel and a secondary display panel, the main display panel having a light-emitting side, and comprising a display part and a non-display part, the secondary display panel being disposed on the light-emitting side of the main display panel and corresponding to the non-display part; and forming a polarization film on a side of the secondary display panel away from the main display panel; and wherein the polarization film comprises a first protection layer, a privacy protection function layer, a polarization function layer, and a second protection layer successively stacked in a direction away from the main display panel, and an orthographic projection of the privacy protection function layer on the main display panel overlaps the display part and the secondary display panel.

10. A spliced display device, comprising:

a housing, having an accommodating space; and a plurality of display modules, arranged in an array in the accommodating space, any two adjacent ones of the display modules being in contact with each other; and wherein each of the display modules comprises:

a main display panel, having a light-emitting side, and comprising a display part and a non-display part;

a secondary display panel, disposed on the light-emitting side of the main display panel, and corresponding to the non-display part; and a privacy protection function layer, disposed on a side of the secondary display panel away from the main display panel; and wherein an orthographic projection of the privacy protection function layer on the main display panel overlaps the display part and the secondary display panel.

11. The spliced display device of claim 10, wherein the display part has a first brightness at a front viewing angle and a s second brightness at a preset angle of side viewing;

the secondary display panel has the first brightness at the front viewing angle and a third brightness at the preset angle of side viewing; and a value of the third brightness is different from a value of the second brightness.

12. The spliced display device of claim 11, wherein the privacy protection function layer has a first area corresponding to the display part and a second area corresponding to the secondary display panel;

the privacy protection function layer comprises a plurality of first microstructures disposed in the first area and a plurality of second microstructures disposed in the second area; and each of the first microstructures and each of the second microstructures have a same structure.

13. The spliced display device of claim 12, wherein a value of the second brightness is less than a value of the third brightness;

the first microstructures have a first distribution density in the first area, and the second microstructures have a second distribution density in the second area; and a value of the first distribution density is less than or equal to a value of the second distribution density.

14. The spliced display device of claim 13, wherein
any two adjacent ones of the display modules comprise a first display module and a second display module; and
the privacy protection function layer of the first display module and the privacy protection function layer of the second display module are integrally formed.

15. The spliced display device of claim 14, wherein the secondary display panel of the first display module and the secondary display panel of the second display module are integrally formed.

16. The spliced display device of claim 15, wherein the secondary display panel of the first display module and the secondary display panel of the second display module are integrally formed.

17. The spliced display device of claim 10, wherein
each of the display modules further comprises a polarization function layer disposed on a side of the privacy protection function layer facing the main display panel, and an orthographic projection of the polarization function layer on the main display panel overlaps the display part and the secondary display panel.

18. The spliced display device of claim 17, wherein
each of the display modules further comprises a first protection layer and a second protection layer;
the first protection layer is disposed on a side of the polarization function layer facing the main display panel, and an orthographic projection of the first protection layer on the main display panel overlaps the display part and the secondary display panel;
the second protection layer is disposed on a side of the privacy protection function layer away from the main display panel, and an orthographic projection of the second protection layer on the main display panel overlaps the display part and the secondary display panel; and
the first protection layer, the polarization function layer, the anti-peeping functional layer, and the second protection layer constitute a polarization film.

19. The spliced display device of claim 10, wherein
a type of the main display panel is different from a type of the secondary display panel, and each of the main display panel and the secondary display panel is selected from a liquid crystal display panel, a micro light emitting diode display panel, a mini light emitting diode display panel, an organic light emitting diode display panel, and a quantum dot display panel.

20. The spliced display device of claim 19, wherein the main display panel is the liquid crystal display panel and the secondary display panel is the mini light emitting diode display panel.

\* \* \* \* \*